(12) United States Patent
Tay et al.

(10) Patent No.: US 9,640,459 B1
(45) Date of Patent: May 2, 2017

(54) SEMICONDUCTOR DEVICE INCLUDING A SOLDER BARRIER

(71) Applicant: Infineon Technologies AG, Neubiberg (DE)

(72) Inventors: Wee Boon Tay, Melaka (MY); Kuan Ching Woo, Tampin (MY); Paul Armand Calo, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/987,139

(22) Filed: Jan. 4, 2016

(51) Int. Cl.
| | |
|---|---|
| *H01L 31/062* | (2012.01) |
| *H01L 31/113* | (2006.01) |
| *H01L 23/495* | (2006.01) |
| *H01L 23/31* | (2006.01) |
| *H01L 23/29* | (2006.01) |

(52) U.S. Cl.
CPC ........ *H01L 23/3185* (2013.01); *H01L 23/293* (2013.01); *H01L 23/49548* (2013.01)

(58) Field of Classification Search
CPC ........... H01L 23/3185; H01L 23/49548; H01L 23/293
USPC ................................. 257/293, 676
See application file for complete search history.

(56) References Cited

U.S. PATENT DOCUMENTS

| | | | |
|---|---|---|---|
| 8,213,121 B2 | 7/2012 | Dela Pena et al. | |
| 8,734,657 B2 | 5/2014 | Au et al. | |
| 2006/0125110 A1* | 6/2006 | Do | H01L 24/11 257/778 |
| 2007/0108565 A1* | 5/2007 | Shim | H01L 21/4828 257/676 |
| 2009/0004774 A1 | 1/2009 | Lee et al. | |
| 2009/0224384 A1 | 9/2009 | Hou et al. | |
| 2014/0217580 A1 | 8/2014 | Myung et al. | |
| 2015/0001697 A1 | 1/2015 | Heng | |

OTHER PUBLICATIONS

"64 Channel Flip-Chip Mounted Selectively Oxidized GaAs VCSEL Array", Roland Jaeger and Christian Jung, Annual Report 1998, Dept. of Optoelectronics, University of Ulm (6 pgs.).
"Development of Backside Process for Alternative Die Attach on HBT", Jason Fender, et al., CS Mantech Conference, May 14-17, 2007, Austin, Texas (4 pgs.).
"Solder/Masks" DITF—Interconnect Technology, http://www.dift.com/solder-masks.html, 2012 (2 pgs).

* cited by examiner

*Primary Examiner* — David S Blum
(74) *Attorney, Agent, or Firm* — Dicke, Billig & Czaja, PLLC

(57) ABSTRACT

A semiconductor device includes a leadframe and a semiconductor chip including a contact. The contact faces the leadframe and is electrically coupled to the leadframe via solder. The semiconductor device includes a solder barrier adjacent to the first contact and an edge of the chip.

20 Claims, 6 Drawing Sheets

SEMICONDUCTOR DEVICE INCLUDING A SOLDER BARRIER

BACKGROUND

When attaching a chip to a leadframe, solder may be reflowed to electrically couple contacts of the chip to the leadframe. Power semiconductor chips may include contacts on both a first side and a second side of the chip such that a current through the chip may flow vertically between the first side and the second side of the chip. When the contacts of a power semiconductor chip are soldered to a leadframe, electrical shorting of the chip should be prevented. In addition, when soldering a semiconductor chip to a leadframe, solder may spread out from underneath the semiconductor chip leading to inconsistent bond line thicknesses between devices.

For these and other reasons, there is a need for the present invention.

SUMMARY

One example of a semiconductor device includes a leadframe and a semiconductor chip including a contact. The contact faces the leadframe and is electrically coupled to the leadframe via solder. The semiconductor device includes a solder barrier adjacent to the first contact and an edge of the chip.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of the examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

Figure 1:
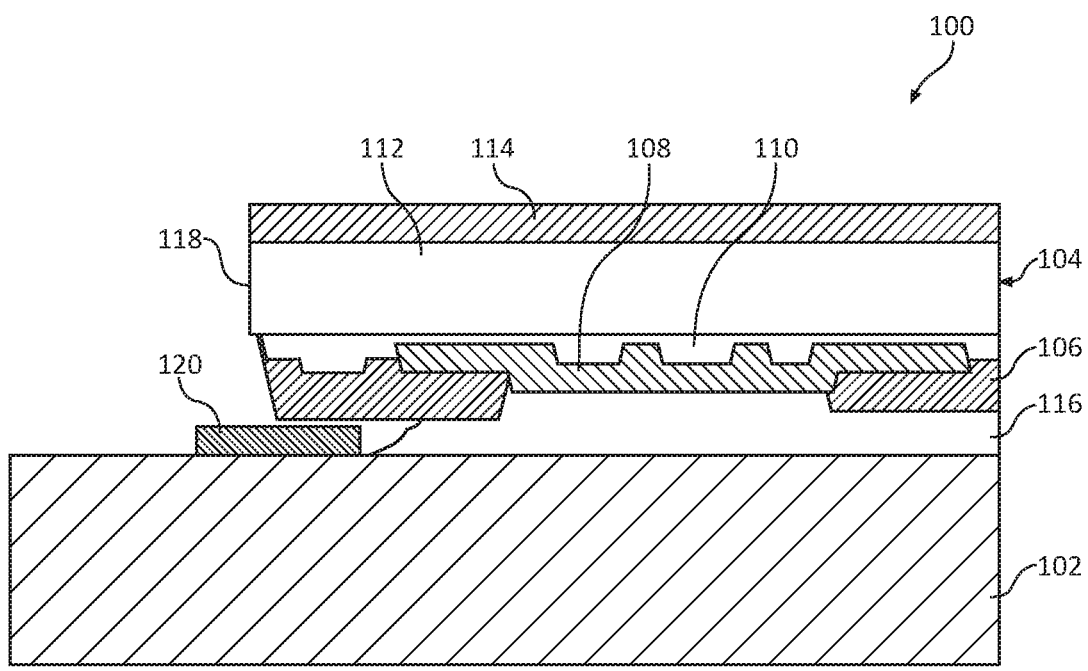
FIG. 1 illustrates a cross-sectional view of one example of a semiconductor device.

FIG. 1 illustrates a cross-sectional view of one example of a semiconductor device 100. Semiconductor device 100 includes a leadframe 102, a semiconductor chip 104, and a solder barrier 120. Semiconductor chip 104 includes a first contact 108 on a first side of semiconductor chip 104 facing leadframe 102. First contact 108 contacts a first semiconductor region 110 of semiconductor chip 104. A dielectric layer 106 contacts first contact 108 and first semiconductor region 110 and defines the first contact pad opening. Semiconductor chip 104 includes a second contact 114 on a second side of semiconductor chip 104 opposite to the first side of semiconductor chip 104. Second contact 114 contacts a second semiconductor region 112 of semiconductor chip 104. In one example, semiconductor chip 104 is a power semiconductor chip and first contact 108 is a gate contact and second contact 114 is a drain contact.

First contact 108 is electrically coupled to leadframe 102 via solder 116. Solder barrier 120 prevents solder 116 from contacting an edge 118 of semiconductor chip 104 during solder reflow when semiconductor chip 104 is attached to leadframe 102. Solder barrier 120 prevents a solder short between first contact 108 and second semiconductor region 112. In this example, solder barrier 120 is formed on leadframe 102. In other examples, solder barrier 120 may be formed on semiconductor chip 104. Solder barrier 120 is adjacent to first contact 108 and edge 118 of semiconductor chip 104. In this example, solder barrier 120 extends under semiconductor chip 104 and extends past edge 118 outside the footprint of semiconductor chip 104. In other examples, solder barrier 120 does not extend outside the footprint of semiconductor chip 104 and is arranged between first contact 108 and edge 118 of semiconductor chip 104.

In one example, solder barrier 120 includes a metal region, such as Ag, Ni, or another suitable metal. The metal region may be formed using a plating process or another suitable process. In another example, solder barrier 120 includes an epoxy or imide region or a region composed of another suitable anti-wetting dielectric material. The anti-wetting dielectric material may be formed by printing or formed using another suitable process. In another example, solder barrier 120 includes an oxide region. The oxide region may be formed using a laser or formed using another suitable process.

Figure 2:
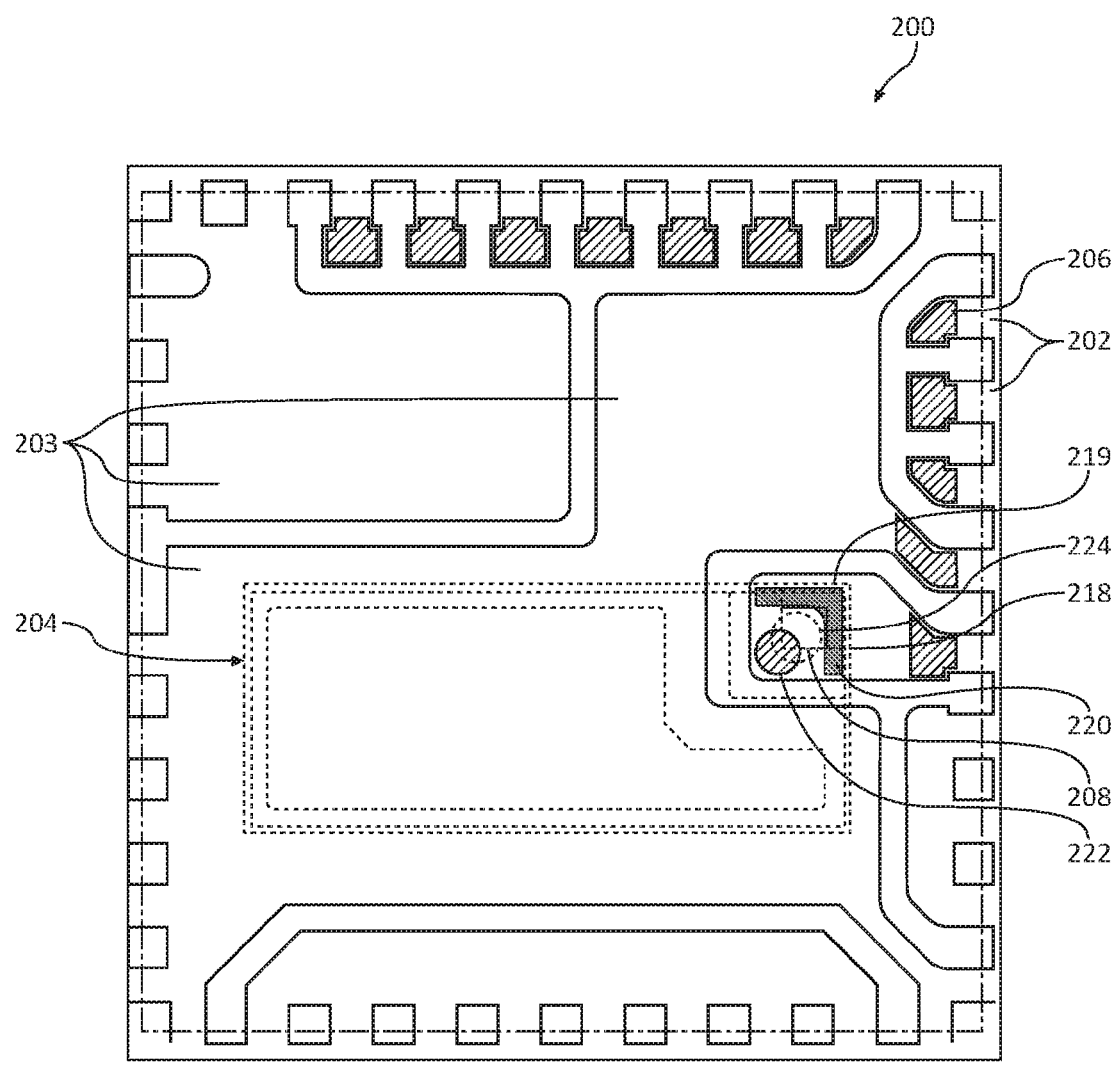
FIG. 2 illustrates a top view of one example of a leadframe.

FIG. 2 illustrates a top view of one example of a leadframe 200. Leadframe 200 includes a plurality of leads indicated for example at 202 and a plurality of die pads 203 for receiving semiconductor chips. Leads 202 may include plated regions 206 for attaching bond wires. In this example, one die pad 203 is for receiving a power semiconductor chip 204. Power semiconductor chip 204 includes a gate contact 208 adjacent edges 218 and 219 of power semiconductor chip 204. A solder barrier 220 is formed between gate contact 208 and edges 218 and 219 to prevent a solder short between gate contact 208 and a drain region of semiconductor chip 204 during solder reflow. Solder barrier 220 may be formed on leadframe 200 or on power semiconductor chip 204. A plated region 222 may be formed adjacent to gate contact 208 opposite to solder barrier 220 to minimize a solder void during solder reflow. Prior to die attach, a solder material, such as a solder paste, is applied to area 224 of leadframe 200. In one example, area 224 is defined by a screen printing opening and the solder material is applied to area 224 using a screen printing process. In another example, solder material is applied to gate contact 208 prior to die attach rather than to leadframe 200.

Figure 3A:
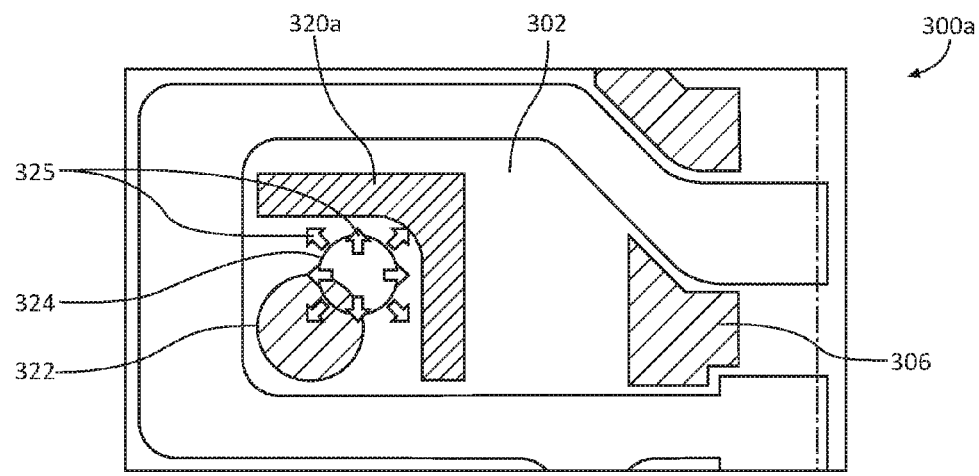
FIGS. 3A-3C illustrate top views of example solder barriers to prevent gate to drain solder shorts along edges of a power semiconductor chip.
Figure 3B:
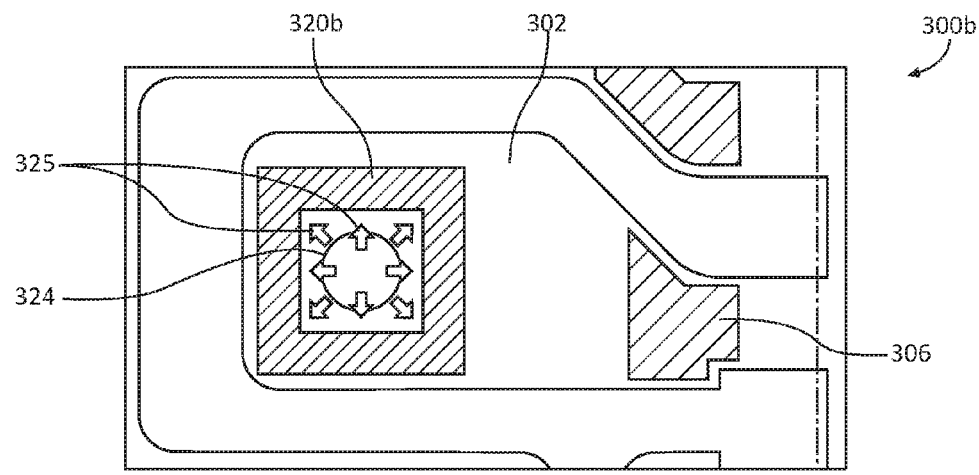
Figure 3C:
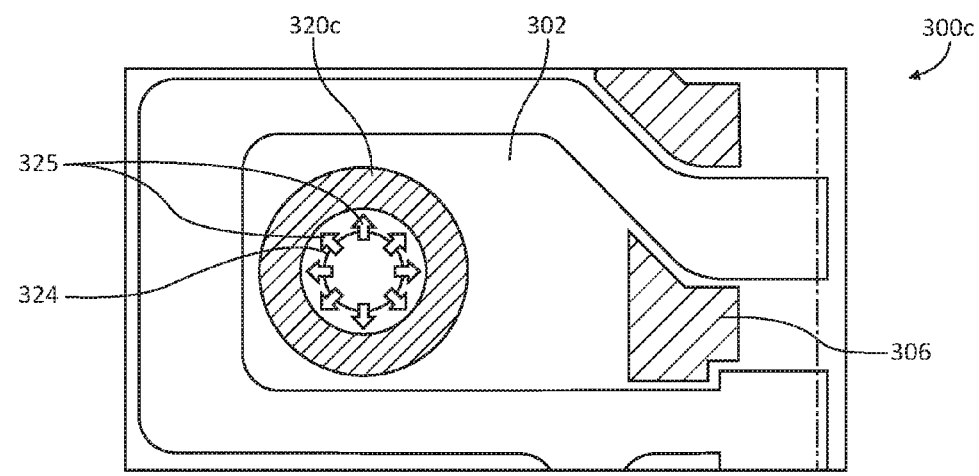

FIG. 3A-3C illustrate top views of example solder barriers to prevent gate to drain solder shorts along edges of a power semiconductor chip. FIG. 3A illustrates a top view of one example of a portion 300a of a leadframe, such as leadframe 200 previously described and illustrated with reference to FIG. 2. Portion 300a includes a gate contact lead 302, a solder barrier 320a, a plated region 322, and an area 324. Lead 302 may include a plated region 306 for attaching bond wires. In this example, solder barrier 320a is L-shaped and prevents a solder short between the gate contact and the drain region of a power semiconductor chip during die attach solder reflow. Solder barrier 320a may include a plated region, an epoxy or imide region, an oxide region, or another suitable anti-wetting material region. Plated region 322 may be formed opposite to solder barrier 320a to minimize a solder void during solder reflow. Area 324 indicates where a solder material is applied to gate contact lead 302 prior to die attach. Arrows 325 indicate solder movement during solder reflow. Solder barrier 320a prevents solder movement to the edges of the power semiconductor chip during die attach solder reflow.

FIG. 3B illustrates a top view of another example of a portion 300b of a leadframe, such as leadframe 200 previously described and illustrated with reference to FIG. 2. Portion 300b includes a gate contact lead 302, a solder barrier 320b, and an area 324. Lead 302 may include a plated region 306 for attaching bond wires. In this example, solder barrier 320b is square shaped, laterally surrounds the gate contact and prevents a solder short between the gate contact and the drain region of a power semiconductor chip during die attach solder reflow. Solder barrier 320b may include a plated region, an epoxy or imide region, an oxide region, or another suitable anti-wetting material region. Area 324 indicates where a solder material is applied to gate contact lead 302 prior to die attach. Arrows 325 indicate solder movement during die attach solder reflow. Solder barrier 320b prevents solder movement to the edges of the power semiconductor chip during die attach solder reflow.

FIG. 3C illustrates a top view of another example of a portion 300c of a leadframe, such as leadframe 200 previously described and illustrated with reference to FIG. 2. Portion 300c includes a gate contact lead 302, a solder barrier 320c, and an area 324. Lead 302 may include a plated region 306 for attaching bond wires. In this example, solder barrier 320c is circle shaped, laterally surrounds the gate contact and prevents a solder short between the gate contact and the drain region of a power semiconductor chip during die attach solder reflow. Solder barrier 320c may include a plated region, an epoxy or imide region, an oxide region, or another suitable anti-wetting material region. Area 324 indicates where a solder material is applied to gate contact lead 302 prior to die attach. Arrows 325 indicate solder movement during die attach solder reflow. Solder barrier 320c prevents solder movement to the edges of the power semiconductor chip during die attach solder reflow.

Figure 4:
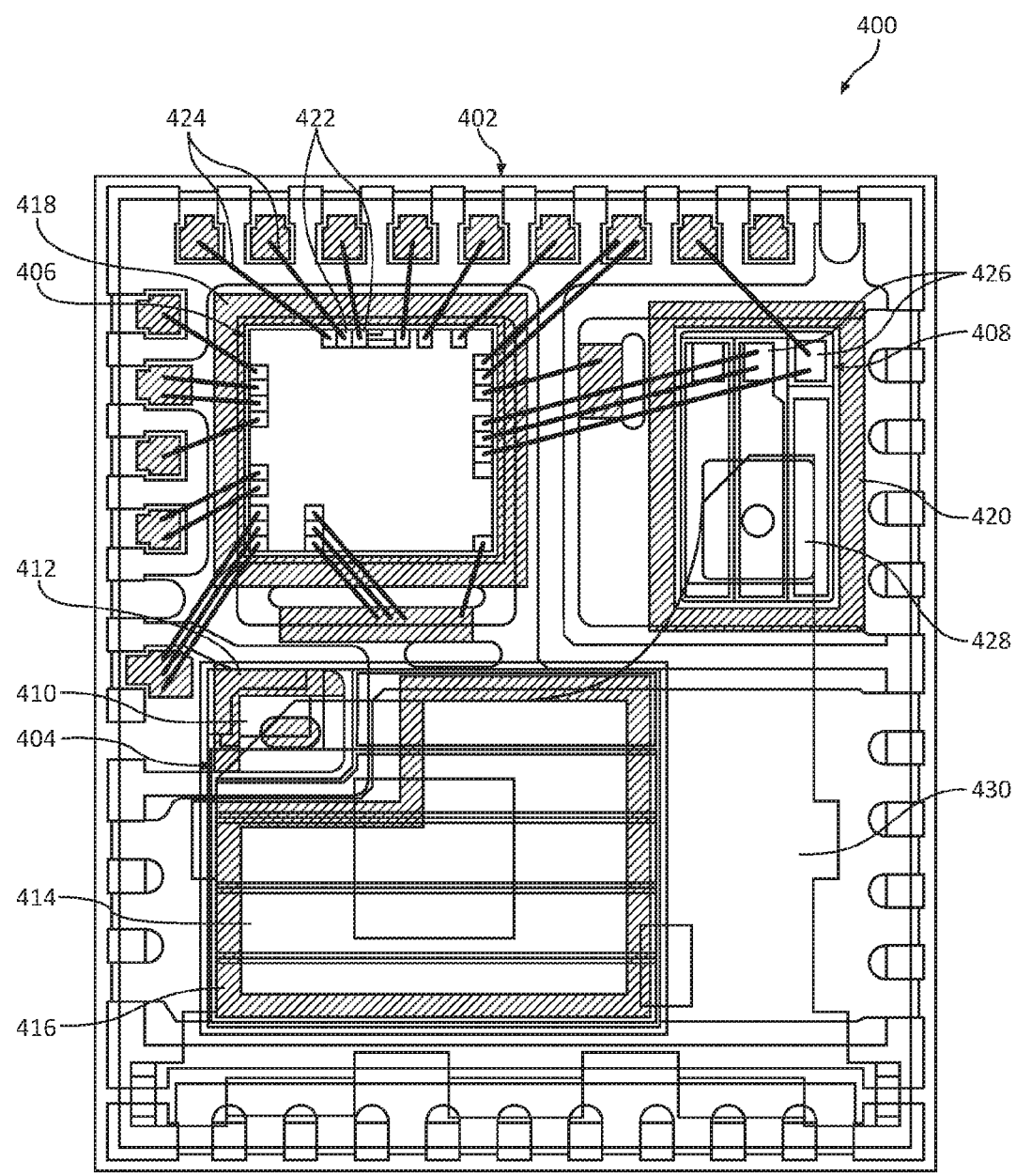
FIG. 4 illustrates a top view of another example of a semiconductor device.

FIG. 4 illustrates a top view of another example of a semiconductor device 400. Semiconductor device 400 includes a leadframe 402, semiconductor chips 404, 406, and 408, and solder barriers 412, 416, 418, and 420. Each semiconductor chip 404, 406, and 408 is soldered to leadframe 402. Semiconductor chip 404 is a power semiconductor chip including a gate contact 410 and a source contact 414 on a first side of the semiconductor chip and a drain contact on a second side of the semiconductor chip opposite to the first side. Gate contact 410 and source contact 414 of semiconductor chip 404 are soldered to leadframe 402. Solder barrier 412 prevents a solder short between gate contact 410 and the drain region of semiconductor chip 404 during die attach solder reflow. In this example, solder barrier 412 is L-shaped as previously described and illustrated with reference to FIG. 3A. Solder barrier 416 prevents a solder short between source contact 414 and the drain region of semiconductor chip 404 during die attach solder reflow. Solder barrier 416 laterally surrounds source contact 414 and is adjacent to the edges of semiconductor chip 404 except along the portion of source contact 414 that is facing gate contact 410.

Solder barrier 418 controls a bond line thickness for semiconductor chip 406. Semiconductor chip 406 is a logic chip including contacts 422 electrically coupled to leads and/or semiconductor chips 404 and 408 via bond wires 424. Solder barrier 418 is formed on leadframe 402 and extends around the edges of semiconductor chip 406. Solder barrier 420 controls a bond line thickness for semiconductor chip 408. Semiconductor chip 408 may be a power semiconductor chip including contacts 426 electrically coupled to leads and/or semiconductor chip 406 via bond wires 424. A contact 428 of semiconductor chip 408 is electrically coupled to the drain contact of semiconductor chip 404 via a clip 430. Solder barrier 408 is formed on leadframe 402 and extends around the edges of semiconductor chip 408.

Figure 5:
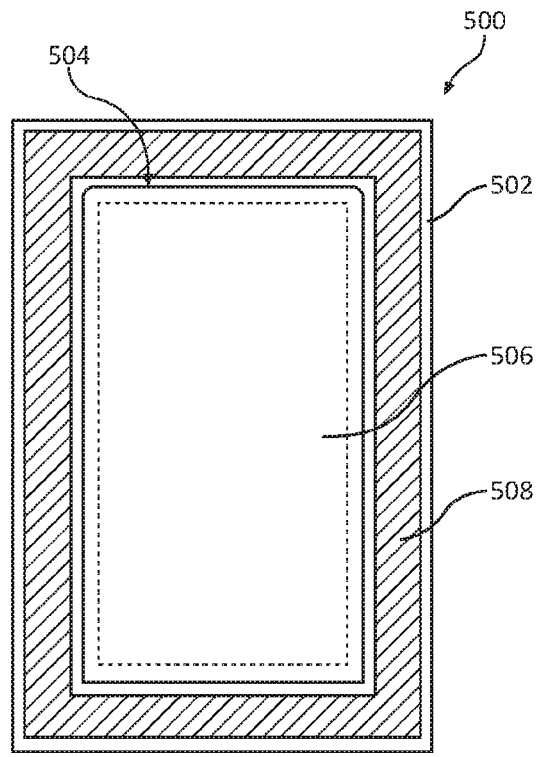
FIG. 5 illustrates a top view of one example of a portion of a semiconductor device including a solder barrier to control bond line thickness.

FIG. 5 illustrates a top view of one example of a portion 500 of a semiconductor device, such as semiconductor device 400 previously described and illustrated with reference to FIG. 4, including a solder barrier to control bond line thickness. Portion 500 includes a leadframe including a die pad 502, a semiconductor chip 504, and a solder barrier 508. Semiconductor chip 504 includes a contact 506 facing die pad 502. Solder barrier 508 extends around the edges of semiconductor chip 504. Solder barrier 508 is formed on die pad 502. Solder barrier 508 may include a plated region, an epoxy or imide region, an oxide region, or another suitable anti-wetting material region.

Solder barrier 508 controls the bond line thickness between semiconductor chip 504 and die pad 502. The bond line thickness is controlled by containing the solder within solder barrier 508. Therefore, by controlling the volume of solder applied during the die attach process and containing the solder within the area defined by solder barrier 508, a controlled height (i.e., bond line thickness) of the solder is provided.

Figure 6:
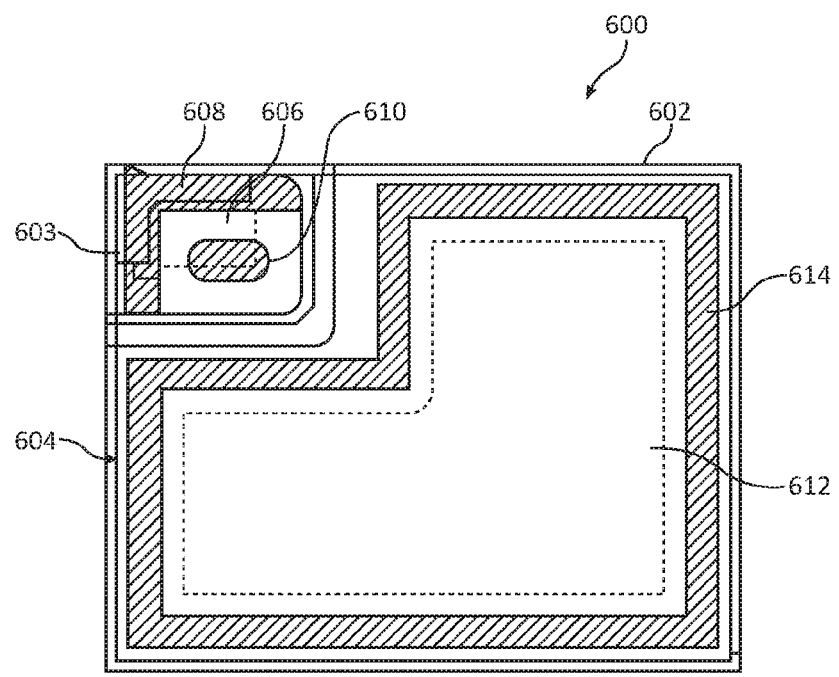
FIG. 6 illustrates a top view of one example of a portion of a semiconductor device including a solder barrier to prevent source to drain solder shorts and gate to drain solder shorts along edges of a power semiconductor chip.

FIG. 6 illustrates a top view of one example of a portion 600 of a semiconductor device, such as semiconductor device 400 previously described and illustrated with reference to FIG. 4, including solder barriers to prevent source to drain solder shorts and gate to drain solder shorts along edges of a power semiconductor chip. Portion 600 includes a leadframe including a die pad 602 and a gate contact lead 603, a semiconductor chip 604, and solder barriers 608 and 614. Semiconductor chip 604 includes a first contact 606 facing lead 603 and a second contact 612 facing die pad 602. Solder barrier 608 is formed between contact 606 and two edges of semiconductor chip 604 on gate contact lead 603. Solder barrier 614 is formed between contact 612 and the edges of semiconductor chip 604 on die pad 602. Solder barriers 608 and 614 may include plated regions, epoxy or imide regions, oxide regions, or other suitable anti-wetting material regions.

Figure 7:
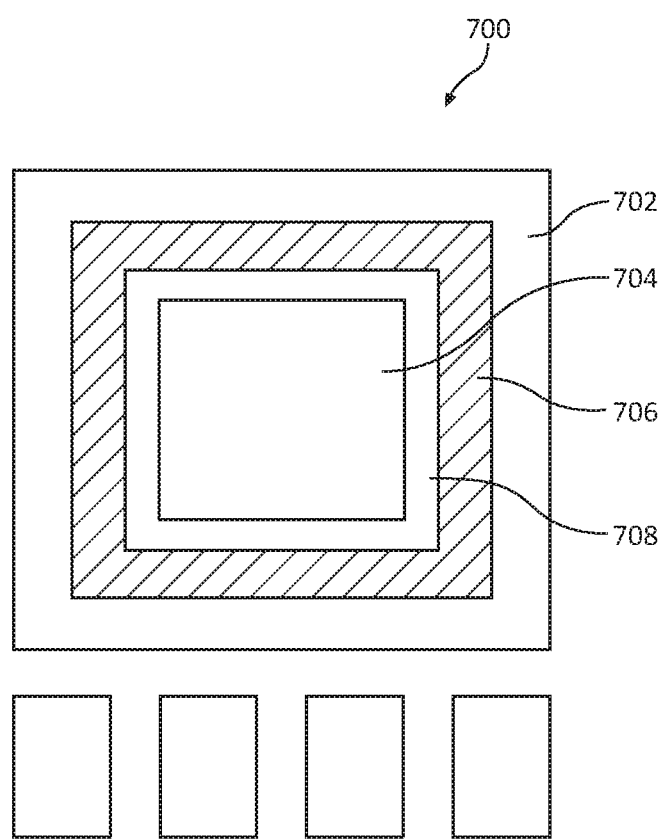
FIG. 7 illustrates a top view of one example of a semiconductor device including a solder barrier to control bond line thickness.

FIG. 7 illustrates a top view of one example of a semiconductor device 700 including a solder barrier 706 to control bond line thickness. Semiconductor device 700 includes a leadframe 702, a semiconductor chip 704, a solder barrier 706, and solder 708. Solder barrier 706 is formed on leadframe 702 and laterally surrounds semiconductor chip 704 to contain solder 708 during die attach solder reflow. In one example, as illustrated in FIG. 7, solder barrier 706 is outside the footprint of semiconductor chip 704 such that solder 708 extends outside the footprint of semiconductor chip 704 during die attach solder reflow. In other examples, solder barrier 706 may by formed such that solder 708 does not extend outside the footprint of semiconductor chip 704. Solder barrier 706 may include a plated region, an epoxy or imide region, an oxide region, or another suitable anti-wetting material region.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a leadframe;
   a semiconductor chip comprising a contact, the contact facing the leadframe and electrically coupled to a surface of the leadframe via solder; and
   a solder barrier adjacent to the contact and an edge of the semiconductor chip, the solder barrier disposed above the surface of the leadframe and at least partially between the semiconductor chip and the surface of the leadframe to prevent the solder from reaching the edge of the semiconductor chip during a solder reflow process.

2. The semiconductor device of claim 1, wherein the solder barrier is on the leadframe.

3. The semiconductor device of claim 1, wherein the solder barrier is on the semiconductor chip.

4. The semiconductor device of claim 1, wherein the solder barrier completely surrounds the edge of the chip.

5. The semiconductor device of claim 1, wherein the solder barrier completely surrounds the contact.

6. The semiconductor device of claim 1, wherein the solder barrier comprises a plated region.

7. The semiconductor device of claim 1, wherein the solder barrier comprises an epoxy or imide region.

8. The semiconductor device of claim 1, wherein the solder barrier comprises an oxide region.

9. A semiconductor device comprising:
   a leadframe;
   a chip comprising a first contact to a first semiconductor region of the chip on a first side of the chip and a second contact to a second semiconductor region of the chip on a second side of the chip opposite to the first side, the first contact adjacent an edge of the chip; and
   a solder barrier extending from the first side of the chip between the first contact and the edge of the chip such that a solder short between the first contact and the second semiconductor region along the edge of the chip is prevented during solder reflow.

10. The semiconductor device of claim 9, wherein the solder barrier comprises a plated region.

11. The semiconductor device of claim 9, wherein the solder barrier comprises an epoxy or imide region.

12. The semiconductor device of claim 9, wherein the solder barrier comprises an oxide region.

13. The semiconductor device of claim 9, wherein the solder barrier laterally surrounds the first contact.

14. The semiconductor device of claim 13, wherein the solder barrier is square shaped.

15. The semiconductor device of claim 13, wherein the solder barrier is circle shaped.

16. The semiconductor device of claim 9, wherein the solder barrier is L-shaped.

17. A semiconductor device comprising:
   a leadframe having a major surface;
   a semiconductor chip comprising a first contact on a first side of the chip, the first contact facing the leadframe and electrically coupled to the leadframe via solder; and
   a solder barrier extending from the major surface of the leadframe, the solder barrier disposed at least partially between the leadframe and the semiconductor chip and laterally surrounding the semiconductor chip, the solder barrier to control bond line thickness.

18. The semiconductor device of claim 17, wherein the solder barrier comprises a plated region.

19. The semiconductor device of claim 17, wherein the solder barrier comprises an epoxy or imide region.

20. The semiconductor device of claim 17, wherein the solder barrier comprises an oxide region.

* * * * *